United States Patent [19]
Canegallo et al.

[11] Patent Number: 6,069,822
[45] Date of Patent: May 30, 2000

[54] METHOD FOR PARALLEL PROGRAMMING OF NONVOLATILE MEMORY DEVICES, IN PARTICULAR FLASH MEMORIES AND EEPROMS

[75] Inventors: Roberto Canegallo, Tortona; Ernestina Chioffi, Pavia; Marco Pasotti, S. Martino Siccomario; Danilo Gerna, Montagna In Valtellina; Pier Luigi Rolandi, Monleale, all of Italy

[73] Assignee: STMicroelectronics S.r.l., Agrate Brianza, Italy

[21] Appl. No.: 09/181,230

[22] Filed: Oct. 27, 1998

[30] Foreign Application Priority Data

Oct. 28, 1997 [EP] European Pat. Off. ............. 97830550

[51] Int. Cl.[7] .................................................. G11C 16/06
[52] U.S. Cl. ............................... 365/185.22; 365/185.18; 365/185.19
[58] Field of Search ......................... 365/185.22, 185.18, 365/185.19

[56] References Cited

U.S. PATENT DOCUMENTS

| | | | |
|---|---|---|---|
| 5,422,842 | 6/1995 | Cernea et al. ........................... | 365/185 |
| 5,495,442 | 2/1996 | Cernea et al. ...................... | 365/185.03 |
| 5,521,864 | 5/1996 | Kobayashi et al. ................. | 365/185.22 |
| 5,532,964 | 7/1996 | Cernea et al. ...................... | 365/189.09 |
| 5,784,318 | 7/1998 | Anami ................................ | 365/185.22 |
| 5,787,038 | 7/1998 | Park .................................... | 365/185.22 |
| 5,864,503 | 1/1999 | Pascucci ............................. | 365/185.22 |

FOREIGN PATENT DOCUMENTS 2302971  2/1997  United Kingdom .

*Primary Examiner*—Son T. Dinh
*Attorney, Agent, or Firm*—Theodore E. Galanthay; Robert Iannucci; Seed IP Law Group PLLC

[57] ABSTRACT

The programming method comprises the steps of applying a programming pulse to a first cell and simultaneously verifying the present threshold value of at least a second cell; then verifying the present threshold value of the first cell and simultaneously applying a programming pulse to the second cell. In practice, during the entire programming operation, the gate terminal of both the cells is biased to a same predetermined gate voltage and the source terminal is connected to ground; the step of applying a programming pulse is carried out by biasing the drain terminal of the cell to a predetermined programming voltage and the step of verifying is carried out by biasing the drain terminal of the cell to a read voltage different from the programming voltage. Thereby, switching between the step of applying a programming pulse and verifying is obtained simply by switching the drain voltage of the cells.

18 Claims, 2 Drawing Sheets

METHOD FOR PARALLEL PROGRAMMING OF NONVOLATILE MEMORY DEVICES, IN PARTICULAR FLASH MEMORIES AND EEPROMS

TECHNICAL FIELD

The present invention relates to a method for parallel programming of nonvolatile memory devices, in particular flash memories and EEPROMs.

BACKGROUND OF THE INVENTION

As is known, the cells of a memory are programmed by biasing the gate terminal of the cell to be written (through a word line) to a predetermined first potential (for example 8–9 V), biasing the drain terminal to a predetermined second potential (for example 5 V), and biasing the source terminal to ground. Thus, by hot electron injection, electrons are trapped in the floating gate region of the cell, and therefore the threshold voltage of the cell is modified.

By its very nature, the phenomenon of hot electron injection is uncontrolled and cannot be repeated with precision; consequently, programming is carried out by providing a plurality of programming pulses and reading the threshold voltage of the cell after each programming pulse (verifying step), to evaluate whether the required value has been reached, and decide whether to apply further programming pulses.

In case of programming several cells of the array, the cells are programmed serially, i.e., programming of one cell is completed before beginning with programming a subsequent cell. This process therefore requires a considerable amount of time, which is directly proportional to the number of cells to be programmed and to the target threshold value.

SUMMARY OF THE INVENTION

An object of the invention is to provide a method to reduce the programming time when programming more than one cell.

This is accomplished, according to the present invention, by a method provided for parallel programming of at least two cells of a nonvolatile memory device, in particular a flash memory, each having a gate, a drain and source terminals, comprising the application of a programming pulse to said cells and verifying a present threshold voltage value simultaneously.

BRIEF DESCRIPTION OF THE DRAWINGS

For understanding the present invention, a preferred embodiment is now described, purely by way of non-limiting example, with reference to the attached drawings.

DETAILED DESCRIPTION OF THE INVENTION

Figure 1:
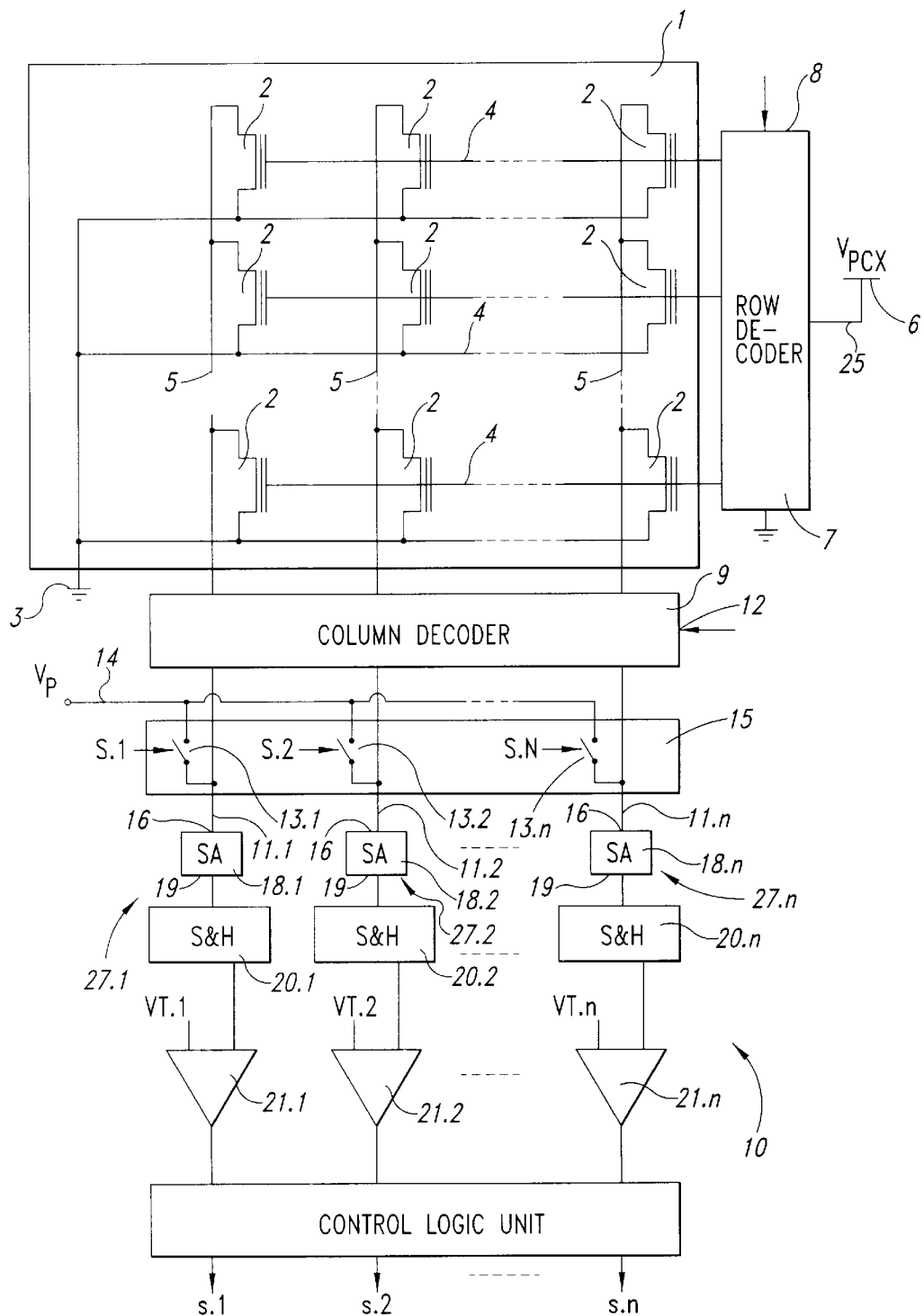
FIG. 1 is a block diagram of a nonvolatile memory.

In FIG. 1, the memory 10 comprises a memory sector 1 comprising a plurality of cells 2 arranged in rows and columns. The control gate terminals of the cells 2 arranged on a same row are connected to one another by a word line 4, the drain terminals of the cells 2 arranged on a same column are connected to one another by a bit line 5, and the source terminals of all the cells 2 are connected to one another and are available externally (in the illustrated example, during the programming step, they are connected to the ground line 3).

The word lines 4 are connected to a row decoder 7 that has a control input 8 and a bias input 25, and is connected to a line 6 set to a potential $V_{PCX}$. The purpose of the row decoder 7 is to bias the word lines 4 in the manner described below, and as specified by address signals provided at the control input 8.

The bit lines 5 are connected to a column decoder 9 which, as specified by address signals provided in known manner to a control input 12 thereof, connects the bit lines 5 selectively to bias lines 11.1, 11.2 ... 11.n, each of which is connected to a corresponding circuit 27.1, 27.2 ... 27.n for independently biasing and reading the threshold voltage of the cell 2. In particular, the bias lines 11.1, 11.2 ... 11.n are connected by respective switches 13.1, 13.2 ... 13.n to a line 14 set to a programming potential $V_P$, and the switches 13.1, 13.2 ... 13.n have each a control terminal receiving a respective control signal s.1, s.2 ... s.n, and together form a switching matrix 15. The bias lines 11.1, 11.2 ... 11.n are each connected to an input 16 of a respective read circuit ("sense amplifier", indicated as SA in FIG. 1) 18.1, 18.2 ... 18.n, having the aim of setting the bias lines 11.1, 11.2 ... 11.n to a read voltage $V_R$ and of reading the present threshold value of the cells 2 connected to them, as explained hereinafter with reference to FIG. 3.

Outputs 19 of the read circuits 18.1, 18.2 ... 18.n are each connected to a respective data storage circuit ("sample and hold" circuit, indicated as S&H in FIG. 1) 20.1, 20.2 ... 20.n; in turn, each data storage circuit is connected at its output to a first input of a respective comparator 21.1, 21.2 ... 21.n, the second input of which receives a respective comparison value VT.1, VT.2 ... VT.n which is correlated to the target threshold voltage for the cell to be programmed, as described in detail hereinafter.

The outputs of the comparators 21.1, 21.2 ... 21.n are connected to a control logic unit 24 which generates at its output the signals s.1, s.2 ... s.n which are provided to the switches 13.1, 13.2 ... 13.n.

In particular, by closing switches 13.1, 13.2 ... 13.n, the control logic unit allows application of a programming pulse to a first cell 2 to be programmed, whereas the other cells to be programmed are maintained in a read condition, it then controls transmission of a programming pulse to a successive cell to be programmed (for example the cell which is adjacent to the previous one), and the other cells, including the first cell, are maintained in a read condition. The process continues in the same manner until the programming pulse is applied to the final cell to be programmed. Then (if the output of the comparator which is connected to the first cell indicates that the value of the first cell is lower than the target threshold value), the control logic unit controls transmission of a second programming pulse to the first cell, then to the second, and so on. On the other hand if the first (or a subsequent cell) has reached the target threshold value, it no longer receives the programming pulse and the programming step is continued for the further cells which have not yet reached the respective target threshold. The process is continued until all the cells to be programmed have reached the target threshold voltage, as shown in the example given in the following table, which refers to a case in which four cells identified as A, B, C and D are to be programmed.

| cells/time | t0 | t1 | t2 | t3 | t4 | t5 |
|---|---|---|---|---|---|---|
| A | read | prog. | read | read | read | prog. |
| B | read | read | prog. | read | read | read |
| C | read | read | read | prog. | read | read |
| D | read | read | read | read | prog. | read |

Thereby, while reading a cell that has just received a programming pulse, a programming pulse is supplied to another cell, with a parallel programming process. Therefore, during programming, time saving is obtained as a whole, since the time necessary for verifying one cell is used to supply a programming pulse to another cell.

According to another aspect of the present invention, the bias voltage of the gate terminal of the cells 2 to be programmed remains the same both during the programming pulse application step and during the verify reading step, and switching between these two steps is determined solely by the voltage which is present on the bit line 5 of the cell 2 to be programmed, as described hereinafter with reference to FIG. 2, which contains a simplified diagram relating to those components 10 of the memory of FIG. 1 which are used in the programming of a cell. In particular in FIG. 2, of the row decoder 7, a switch 30 is shown which allows the word line 4 connected to the cell 2 to be programmed to be biased to the gate bias voltage $V_{PCX}$. In addition, of the column decoder 9, a switch 31 is shown which allows the bit line 5 of the cell to be programmed to be connected to the respective sense amplifier 18. The remainder of the components shown in FIG. 2 correspond exactly to those in FIG. 1.

Figure 2:
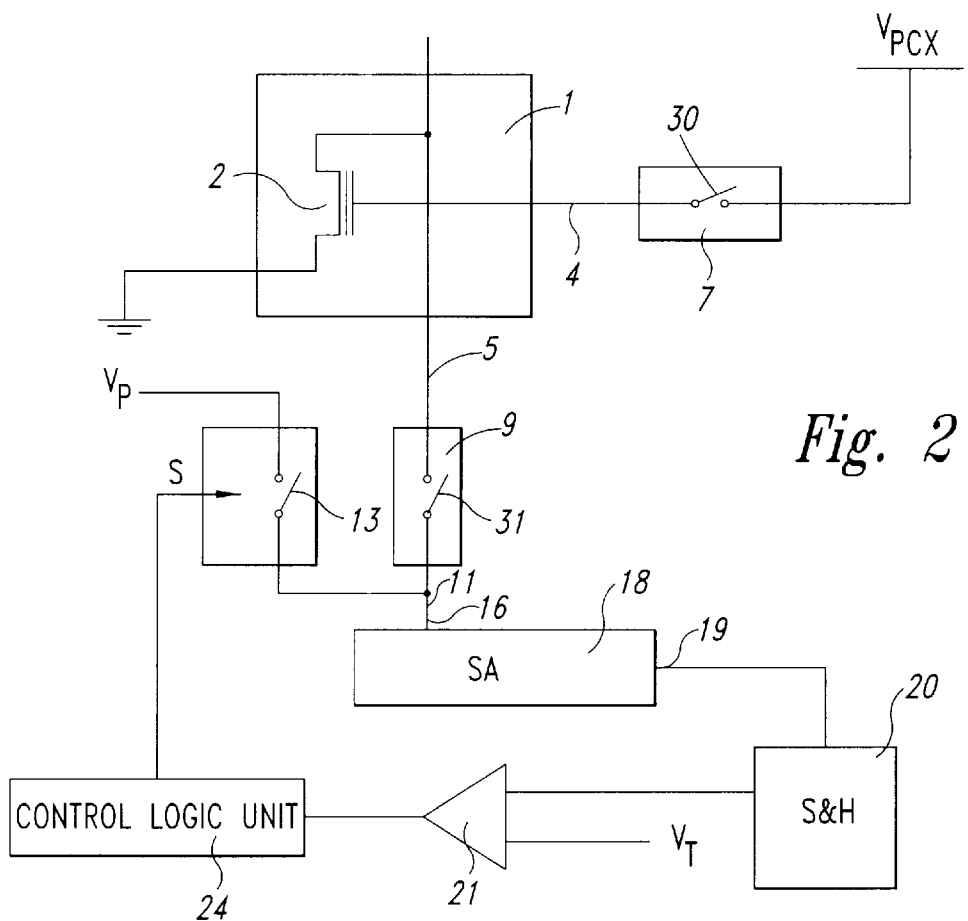
FIG. 2 is a simplified block diagram of the memory, referred to a single cell.

In the circuit in FIG. 2, when the cell 2 is to be programmed, switches 30 and 31 are closed, and switch 13 is kept open. In this condition, word line 4 is biased to a gate voltage $V_{PCX}$ (for example 8 V and in general comprised between 7 and 9 V) and, as explained in greater detail hereinafter with reference to FIG. 3, bit line 5 is biased to a read voltage $V_R$ (for example of 0.5–0.7 V) as determined by the sense amplifier 18. In this condition, the present threshold value of the cell 2 is read by the sense amplifier 18 and is compared with the target threshold value by comparator 21. If the present threshold value is lower than the target value, control logic unit 24 generates a logic level (for example a "1") of the signal s which causes switch 13 to close, bit line 5 to be biased to voltage $V_P$ (for example 5–6 V, i.e., to a value that is relatively high but lower than $V_{PCX}$), through the switch 31, and a programming pulse to be applied to the gate terminal of the cell 2. The programming pulse (the duration whereof is determined by control logic unit 24 and can be constant and predetermined or variable and dependent on predetermined parameters) ends when the control logic unit causes switching of signal s to the opposite logic level (for example "0") and thus opening of switch 13 and biasing of bit line 5 again to voltage $V_R$, whereas the word line 4 remains biased to $V_{PCX}$. Consequently, the threshold voltage reached by the cell 2 is read again and is stored in the memory circuit 20, simultaneously with programming of another cell 2, as previously described. After the planned cells 2 have been programmed (for example all the cells 2 belonging to the same row as the cell 2 previously considered), if the threshold voltage stored in the circuit 20 is lower than the target threshold value, the control logic unit 24 sends a further programming pulse to the cell 2, thereby closing the switch 13.

Figure 3:
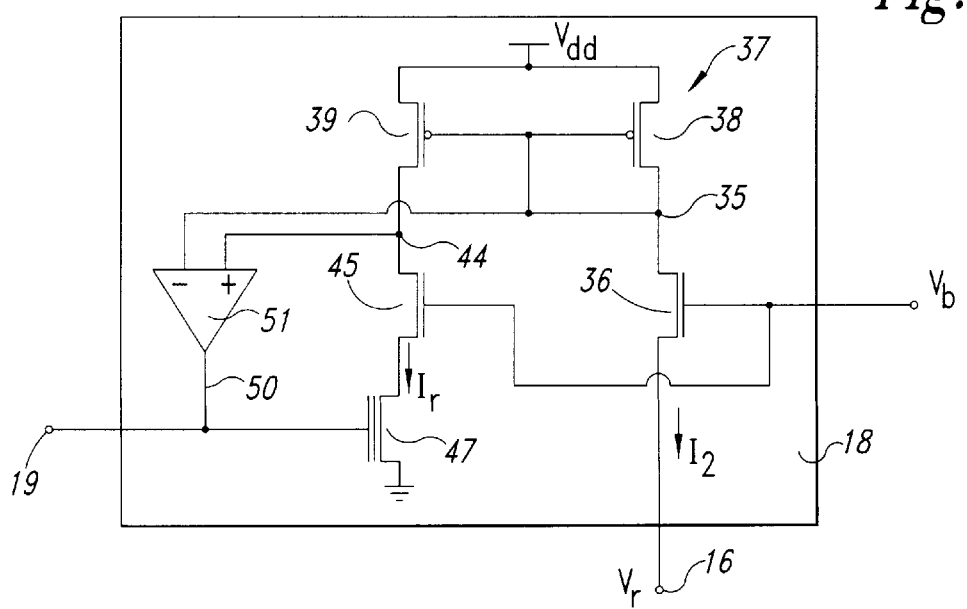
FIG. 3 is a simplified electrical diagram of a block in FIGS. 1 and 2.

The threshold voltage reached by the cell 2 is advantageously read by any acceptable technique. There are many circuits that could be used for this, and one acceptable sense amplifier and technique is shown as described in European patent application no. 97830172.9 entitled "High-precision analog reading circuit for memory arrays, in particular flash analog memory arrays" filed on Apr. 14, 1997 in the name of the same applicant, and incorporated herein by reference. A corresponding US application was filed on Apr. 14, 1998 and bears application Ser. No. 09/060,165, also incorporated by reference. Of course, any other acceptable circuit could also be used. In particular, similarly to the process described in this prior patent application, FIG. 3 shows the input 16 of the sense amplifier 18 is connected to a node 35 by a first bias transistor 36 of NMOS type, which has a gate terminal connected to a bias voltage $V_b$ (for example 1.2–1.4 V). The node 35 is connected to a current mirror device 37 formed by two PMOS transistors 38, 39; in detail, the PMOS transistor 38 is diode-connected (i.e., its drain and gate terminals are short circuited), and has its drain terminal connected to node 35, its source terminal connected to the supply line which is set to $V_{dd}$ and its gate terminal connected to the gate terminal of the PMOS transistor 39; the latter has its source terminal connected to $V_{dd}$ and its drain terminal connected to a node 44.

Node 44 is connected by a second bias transistor 45 also of NMOS type to the drain terminal of a reference cell 47 which is identical to the cells 2 and has a source terminal connected to ground and a gate terminal connected to the output 16 of the sense amplifier 18 and to the output 50 of an operational amplifier 51; the latter has its inverting input connected to the node 35, and its non-inverting input connected to the node 44. The second bias transistor 45 has its gate terminal connected to the gate terminal of the first bias transistor 36, and is thus biased to the same bias voltage $V_b$. The bias transistors 36 and 45 have the function of biasing the bit line 5 (and thus the drain terminal of the cell 2 to be read) and the reference cell 47, to the read voltage $V_R$.

In the aforementioned European application no. 97830172.9, it is shown, as described briefly hereinafter, that sense amplifier 18 has an output voltage $V_o$ which is linearly dependent on the threshold voltage $V_{th2}$ of the cell 2. In fact, when the cell 2 to be read is kept in the linear region, the current $I_2$ flowing through the cell to be read 2 and the current $I_R$ flowing through the reference cell 47 are provided by:

$$I_2 = K^*(W/L)^*[(V_{PCX}-V_{th2})-V_{DS2}/2]^*V_{DS2} \quad (1)$$

$$I_R = K^*(W/L)^*[(V_o-V_{thR})-V_{DSR}/2]^*V_{DSR} \quad (2)$$

wherein K is a constant depending on the production process; W/L is the dimensional width/length ratio of the cells 2, 47; $V_{PCX}$ and $V_o$ are the voltages applied respectively to the gate terminal of the cell 2 and the reference cell 47; $V_{th2}$ and $V_{thR}$ are the threshold voltages respectively of the cell 2 and the reference cell 47; and $V_{DS2}$ and $V_{DSR}$ are respectively the source-drain drops of the cell 2 and the reference cell.

In a read condition:

$$I_2 = I_R \quad (3)$$

In addition, at equilibrium, the voltages at the inputs of operational amplifier 51 (voltages at nodes 35 and 44) are the same, and since bias transistors 36, 45 receive the same bias voltage $V_b$ (for example 1.2–1.4 V) at the gate terminal, they have the same gate-to-source drop; consequently:

$$V_{DS2} = V_{DSR} \quad (4)$$

From (1) and (2), considering (3) and (4), the following is obtained:

$$V_{PCX} - V_{th2} = V_o - V_{thR} \quad (5)$$

i.e.,:

$$V_o - V_{PCX} = V_{th2} - V_{thR} \quad (6)$$

From (6) it is evident that the output voltage $V_o$ is directly proportional to the threshold voltage $V_{th2}$ of the cell 2, so that when threshold voltage $V_{thR}$ of reference cell 47 and gate bias voltage $V_{PCX}$ are known, from the output voltage $V_o$ the present threshold value is immediately obtained and may be compared with the target threshold value. In addition, if the comparison value VT is obtained, similarly to (6), by subtracting the target threshold voltage from the gate bias voltage $V_{PCX}$ and adding the threshold voltage $V_{thR}$ of the reference cell 47, it is possible to compare the output $V_o$ directly with VT, as in the embodiment considered.

The advantages of the described method are as follows. First, it allows reduction of the programming times, since during the verify reading times of a cell, another cell is being programmed in parallel. The application of a single gate voltage during the steps of applying the programming pulses and verifying, permits simplification of the row decoding circuit and reduction of the times required to adjust the voltages to be used in the various steps; in particular, it is advantageous to carry out programming in parallel of the cells to be programmed which are disposed on a single row. In fact, in this case, during the entire operation of programming the cells of a row, the word line connected with these cells is biased at voltage $V_{PCX}$, and the other rows are connected to ground; a command is then issued for sequentially closing the switches 13 connected with the various cells to be programmed, as described above. Therefore, only after programming the last cell of this row, it is necessary to switch the voltage on the word lines to allow programming of the cells of subsequent rows.

The described solution is highly flexible, and can be applied to different categories of memories, of the analog, digital, EEPROM or flash type.

Finally, it will be apparent that many modifications and variants can be applied to the method described and illustrated here, all of which come within the scope of the inventive idea, as defined in the attached claims. In particular, the present threshold voltage can also be read by a circuitry different from the described one, and the target threshold value can also be compared using different components. For example, if the memory is of the analog type, the read values are sampled and then stored by sample and hold circuits, and are compared with analog values; if the memory is of the digital type, analogue/digital converters and digital comparators (for example exclusive ORs) can be used, and the result can be stored in flip-flops.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A method for parallel programming of at least two cells of a nonvolatile memory each having a gate, a drain and a source terminals, comprising:

applying a programming pulse to a first one of said cells, during verifying the present threshold voltage value of a second one of said cells; and applying a programming pulse to said second one of said cells during verifying the present threshold voltage value of said first one of said cells.

2. The method according to claim 1 wherein said cells are disposed on a single line; wherein applying a programming pulse and verifying comprise the steps of biasing said gate terminal to a first, predetermined reference voltage and biasing said source terminal to a second predetermined reference voltage (ground); wherein applying a programming pulse comprises the step of biasing said drain terminal to a third predetermined reference voltage; and verifying comprises the step of biasing said drain terminal to a fourth predetermined reference voltage ($V_R$) different from said third predetermined reference voltage.

3. The method according to claim 2 wherein said fourth predetermined reference voltage is lower than said third predetermined reference voltage.

4. The method according to claim 1 wherein the step of verifying a present threshold voltage value comprises the steps of acquiring said present threshold voltage value and comparing said present threshold voltage value with a target threshold voltage value.

5. The method of claim 1, for programming a plurality of cells which are arranged on a single line, comprising:

a) biasing said gate and source terminals of said plurality of cells respectively to a first and a second predetermined reference voltage;

b) biasing said drain terminal of a first one of said plurality of cells to a third predetermined reference voltage, and biasing said drain terminals of said plurality of cells, apart from said first cell, to a fourth predetermined reference voltage different from said third predetermined reference voltage; and acquiring the present threshold voltage values of said plurality of cells, apart from said first cell, and comparing said present threshold voltage values with target threshold voltage values;

c) biasing said drain terminal of a subsequent cell of said plurality of cells to said third predetermined reference voltage and biasing said drain terminals of said plurality of cells, apart from said subsequent cell, to said fourth predetermined reference voltage; acquiring the present threshold voltage values of said plurality of cells, apart from said second cell, and comparing said present threshold voltage values with said target threshold voltage values;

d) repeating said step c) for all the cells of said plurality;

e) if the present threshold voltage value of said first cell has a predetermined correlation to said target threshold voltage value of said first cell, repeating step b); otherwise repeating step c) until none of the present threshold voltage values have said predetermined correlation to said target threshold voltage values.

6. The method according to claim 5 wherein said predetermined correlation is that said present threshold voltage value is lower than said target threshold voltage value.

7. A device for parallel programming at least two cells of a nonvolatile memory, having each a gate, a drain and a source terminals, comprising simultaneous programming and verify reading control means for applying a programming pulse to a first one of said cells while simultaneously verify reading a present threshold voltage value of a second one of said cells, and verify reading a threshold voltage value of the first one of said cells while applying a programming pulse to the second one of said cells.

8. The device according to claim 7 wherein said cells are disposed on a single line, the device further comprises first supply means supplying a first reference voltage and connected to said gate terminals of said cells; and second supply means supplying a second reference voltage and connected to said source terminals of said cells; and said simultaneous control means comprises third supply means supplying a third reference voltage; fourth supply means supplying a fourth reference voltage; and selector means selectively supplying said third reference voltage to said first cell, while applying the fourth reference voltage to said second cell, and selectively supplying said fourth reference voltage to said first cell while applying said third reference voltage to said second cell.

9. The device according to claim 8 wherein said simultaneous control means comprise at least two bias and read circuits, each bias and read circuit comprising a sense amplifier having an input connectable to a respective drain terminal of a respective cell; a switch component interposed between said third means and the input of the respective sense amplifier; and a threshold comparator having a first input connected to a respective sense amplifier and a second input receiving a target threshold value and an output; the outputs of said threshold comparators being connected to a control logic unit for controlling said switch components.

10. In a memory device comprising a matrix of nonvolatile memory cells, a method for parallel programming a group of cells comprising:

applying a programming pulse to a first one of the group of cells;

verifying a threshold voltage value of all the other cells in the group while applying the programming pulse to the first of the cells; and repeatedly applying the programming pulse to another of the cells in the group while verifying a threshold voltage value of all the other cells in the group including the first one of the cells until all the cells to be programmed are programmed to a predetermined level.

11. The method of claim 10 wherein verifying a threshold voltage value comprises acquiring the threshold voltage value and comparing the threshold voltage value to a target threshold voltage value.

12. The method of claim 10 wherein each of the cells in the group of cells has a source terminal, a drain terminal, and a gate terminal, and wherein applying a programming pulse comprises:

biasing the gate and source terminals of the group of cells to a first and second predetermined reference voltage, respectively;

biasing the drain terminal of a first one of the group of cells to a third predetermined reference voltage;

biasing the drain terminals of the group of cells, except the first one of the cells, to a fourth predetermined reference voltage that is different from the third predetermined reference voltage.

13. The method of claim 12 wherein the threshold voltage value of each of the cells in the group is acquired, except from the first one of the cells, and compared to a target threshold voltage value.

14. A memory device having a plurality of nonvolatile memory cells comprising:

a memory cell programming circuit structured to program memory cells to a predetermined voltage;

a cell verifying circuit structured to verify a programming level of memory cells; and control circuitry coupled to the memory cell programming circuit and to the cell verifying circuit, the control circuitry structured to program one of a group of memory cells while verifying a respective programming level of each of the other memory cells in the group.

15. The memory device of claim 14 wherein the control circuitry is further structured to apply a programming pulse to a first one of the group of cells while simultaneously reading a threshold voltage value of a second one of the group of cells, and to read a threshold voltage value of the first on of the group of cells while simultaneously applying a programming pulse to the second one of the group of cells.

16. The memory device of claim 14 wherein the control circuitry further comprises:

a plurality of supply circuits each structured to supply a respective reference voltage; and selector circuitry structured to selectively supply one of the respective reference voltages to one cell of the group of cells while supplying another of the respective reference voltages to one of the other cells of the group of cells.

17. The memory device of claim 14 wherein:

each of the memory cells is coupled to a single bit line.

18. The memory device of claim 14 wherein the control circuitry is further comprised of bias and read circuits, each bias and read circuit comprising:

a sense amplifier having an input coupled to a drain terminal of a respective one of the group of cells;

a switch coupled between a supply circuit and the input of the sense amplifier;

a threshold comparator, having a first input coupled to the sense amplifier and a second input adapted to receive a target threshold value and the threshold comparator also having an output; and a control logic unit coupled to the output of the threshold comparator, the control logic unit controlling the switch.

* * * * *